United States Patent [19]

Wheatley, Jr.

[11] 4,216,442
[45] Aug. 5, 1980

[54] CONTROL CIRCUIT FOR MULTIVIBRATOR

[75] Inventor: Carl F. Wheatley, Jr., Somerset, N.J.

[73] Assignee: RCA Corporation, New York, N.Y.

[21] Appl. No.: 965,110

[22] Filed: Nov. 30, 1978

[51] Int. Cl.² .................. H03K 3/282; H03K 3/284
[52] U.S. Cl. ............................ 331/113 R; 307/273; 331/117 R
[58] Field of Search ............... 331/113 R, 144, 145, 331/111, 177 R; 307/273

[56] References Cited

U.S. PATENT DOCUMENTS

| | | | |
|---|---|---|---|
| 3,559,096 | 1/1971 | Lokerson | 331/113 R |
| 3,849,673 | 11/1974 | Koo | 307/235 R |
| 3,942,134 | 3/1976 | Schade, Jr. | 331/113 R |
| 3,973,571 | 8/1976 | Suhel | 331/113 R X |
| 4,009,404 | 2/1977 | Kuo | 307/273 |

OTHER PUBLICATIONS

Golden, "Darlington transistors widen multivibrator's range", Electronics, Nov. 25, 1968, p. 82.
Surprenant, "Variable frequency multivibrator has wide range", The Electronic Engineer, Apr. 1970, pp. 83–85.

*Primary Examiner*—Siegfried H. Grimm
*Attorney, Agent, or Firm*—H. Christoffersen; Henry I. Schanzer

[57] ABSTRACT

A multivibrator in which a timing capacitor is connected between the collector of a first transistor and the base of a second transistor and in which a current source connected to the collector of the first transistor provides the charging current for the timing capacitor. The conduction path of a third transistor is connected between the collector and base of the first transistor and its control electrode is connected to a control voltage point for controlling the charging period of the capacitor and for ensuring oscillation when the multivibrator is connected as an astable multivibrator.

10 Claims, 3 Drawing Figures

CONTROL CIRCUIT FOR MULTIVIBRATOR

This invention relates to switching circuits and, in particular, to improvements in circuits known in the art as multivibrators. These include monostable multivibrators having one stable state as well as astable multivibrators having two quasi-stable states between which periodic transitions are made.

An astable multivibrator of interest is shown, for example, in FIG. 2 of U.S. Pat. No. 3,942,134 issued to Schade, Jr. and assigned to RCA Corporation. The circuit includes two cross-coupled switching transistors (Q1, Q2) connected at their emitters to ground potential. Furthermore, the collector of each transistor is connected via a current source transistor (Q3, Q4) to a point of operating potential ($+V_{CC}$ volts) and via a timing capacitor (C1, C2) to the base of the other cross-coupled transistor. The current source in the collector of each cross-coupled transistor provides the charging current for the timing capacitor connected to the collector. The charging path for each timing capacitor (C1, C2) includes the current source in the collector of one cross-coupled transistor and the base-to-emitter path of the other cross-coupled transistor.

In the absence of additional circuitry, it is possible for the capacitively cross-coupled transistors to assume an operating condition in which both timing capacitors become fully charged with the cross-coupled transistors being non-conducting. It is, therefore, desirable to have a simple circuit which can ensure the start of oscillation. It is also desirable to have a circuit which can control the charging period or frequency of the multivibrator.

Accordingly, circuits embodying the invention include means for controlling the charging period of a timing capacitor which is connected between the collector of a first transistor and the base of a second transistor and in which the timing capacitor is charged via a current source connected to the collector of the first transistor. The means for controlling the charging period of the capacitor includes a third transistor having its conduction path directly connected between the collector and base of the first transistor and having its control electrode connected to a control voltage point for turning on the first, cross-coupled, transistor when its collector voltage comes within a predetermined value of the control voltage.

Figure 1:
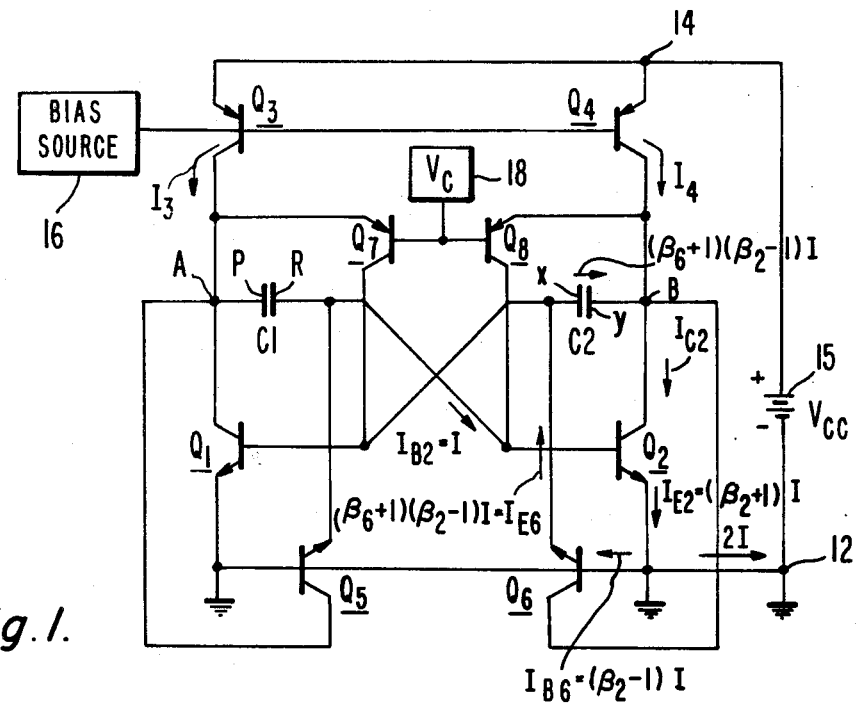
FIG. 1 is a schematic diagram of an astable multivibrator embodying the invention.

The astable multivibrator shown in FIG. 1 includes cross-coupled switching transistors Q1 and Q2 of NPN conductivity type connected at their emitters to conductor 12. A timing capacitor C1 is connected at one plate (R) to the base of transistor Q2 and at its other plate (P) to node A to which are also connected the collectors of transistors Q1 and Q3. A timing capacitor C2 is connected at one plate (X) to the base of transistor Q1 and at its other plate (Y) to node B to which are also connected the collectors of transistors Q2 and Q4.

A source 15 of direct current (d.c.) operating potential (e.g. a battery), having an amplitude of $+V_{CC}$ volts, is connected between conductors 12 and 14 with $+V_{CC}$ volts applied to conductor 14 and ground potential to conductor 12.

PNP transistors Q3 and Q4 are connected at their emitters to conductor 14 and at their collectors to nodes A and B, respectively. A bias source 16 is connected to the bases of transistors Q3 and Q4 for controlling the base current of these two transistors and hence their collector currents (I3, I4) which are the charging currents for C1 and C2. Bias source 16 may be any one of a known number of circuits including master sources for current mirrors, which can be programmed to control or vary the base currents of Q3 and Q4 and hence the currents I3 and I4. The amplitude of I3 and I4 may be, ideally, varied over many orders of magnitude from the subpicoampere range to the ampere range. Practical limitations are imposed by leakage currents at the low end of the current range and by current carrying capacity or forward current gain ($\beta$) fall-off at the high end of the current range. Transistors Q3 and Q4 function as relatively constant current generators (which source or supply currents) in that the amplitude of their collector currents (I3, I4), once set, are relatively independent of the loads connected to their collectors. For transistors Q3 and Q4 to function as constant current sources, they must be operated in the linear range; that is, in the range between cut-off and saturation. For ease of the description to follow, it is assumed that I3 and I4 are equal to each other and equal to a unit of current I. In practice, I3 and I4 may have different values depending, for example, on the geometries of transistors Q3 and Q4. The means for quickly discharging the timing capacitors includes NPN transistors Q5 and Q6 whose bases are connected to the emitters of Q1 and Q2. The collector-to-emitter path of Q5 is connected cross C1 and the collector-to-emitter path of Q6 is connected across C2. Transistors Q5 and Q6 provide a high current discharge path for capacitors C1 and C2, respectively, and also function to clamp the voltage at the bases of transistors Q2 and Q1, to one $V_{BE}$ drop below the potential (ground) applied to conductor 12 when there is a negative going transition of the potential at nodes A or B, respectively.

Figure 2:
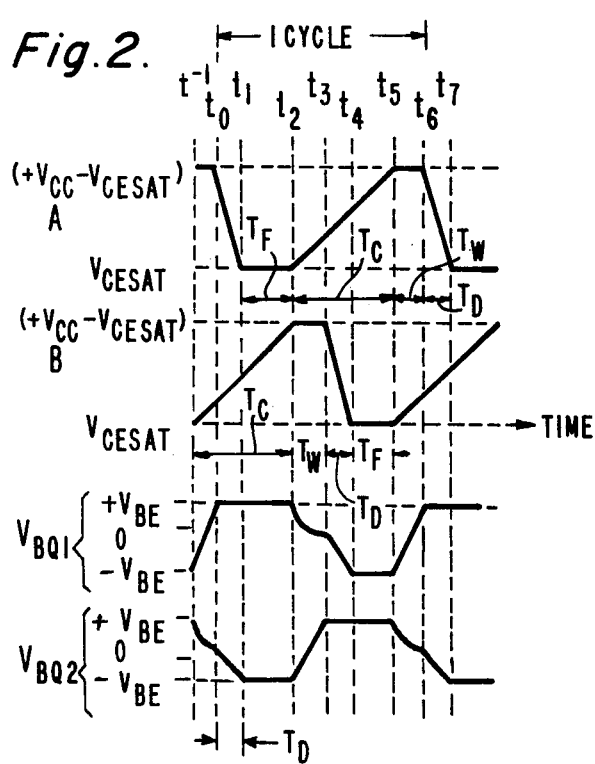
FIG. 2 is a diagram of idealized waveforms associated with various nodes of the FIG. 1 circuit.

The operation of the circuit will now be examined (assuming transistors Q7 and Q8 shown in FIG. 1 are not in the circuit) with reference to the waveforms shown in FIG. 2.

In the circuit of FIG. 1 each timing capacitor goes through a cycle which includes a charging period ($T_C$), a dwell period ($T_W$), a discharging period ($T_D$), and an off period ($T_F$). While one (e.g. C1) of the two timing capacitors is being charged from $V_{CESAT}$ to $V_{CC}$-$V_{CESAT}$ the other timing capacitor (e.g. C2) goes through the dwell, discharging and off periods.

The charging path for each timing capacitor (e.g. C1) includes the collector-to-emitter path of the current source transistor (e.g. Q3) to which one (P) of its plates is connected and the base-to-emitter path of the cross-coupled transistor (e.g. Q2) to whose base the other one (e.g. R) of its plates is connected.

During the $T_C$ of a timing capacitor: (a) the plate (e.g. P) of the capacitor (e.g. C1) connected to the current source (e.g. Q3) gets charged from a low level of $V_{CESAT}$ to a high level of ($V_{CC}$-$V_{CESAT}$) volts by the current source (e.g. Q3) while its other plate (R) connected to the base of the other cross-coupled transistor (e.g. Q2), is quickly charged from $-V_{BE}$ volts to $+V_{BE}$ volts and is then held at $V_{BE}$ volts; (b) the cross-coupled transistor (e.g. Q1) whose collector is connected to the capacitor (e.g. C1) being charged is cut off since its base is held below $+V_{BE}$ volts; (c) the transistor (e.g. Q2) whose base is connected to the capacitor being charged is turned-on, its base current being equal to the capacitor charging current supplied by the current source; and (d) the current source current (e.g. I4) in the collector circuit of the turned on transistor (e.g. Q2) is sunk to ground and the collector is held at $V_{CESAT}$.

The dwell period ($T_W$) of a timing capacitor (C1) begins when the capacitor is fully charged (to $V_{CC}$-$V_{CESAT}$) and there is a concurrent, automatic and substantial decrease of its charging current. As a result, the cross-coupled transistor (e.g. Q2) to whose base the capacitor (C1) is connected no longer sinks the current source (Q4) current (I4) in its collector circuit. A substantial portion of the current source current (e.g. I4) then flows into and through the other timing capacitor (C2) and charges the base-to-emitter capacitance of the other cross-coupled transistor (Q1) from $-V_{BE}$ volts up to $+V_{BE}$ volts. The duration of the dwell period is set by the time it takes the current source to charge to $+V_{BE}$ volts the base of the cross-coupled transistor which was initially at $-V_{BE}$ volts.

The discharge period ($T_D$) of a capacitor is initiated when the cross-coupled transistor to whose collector it is connected turns on. The discharge path for each capacitor (e.g. C1) includes a cross-coupled transistor (e.g. Q1) and a discharge transistor (e.g. Q5). When discharging the timing capacitor the cross-coupled and discharge transistors function as a "darlington" pair with the cross coupled transistor connected between the collector and base of the discharge transistor and supplying base current to the latter.

The off period ($T_F$) of a capacitor follows the discharging period and is defined as the period during which one plate of the timing capacitor is held at $V_{CESAT}$ and the other plate is at $(-)$ $V_{BE}$ volts.

The operation of the circuit of FIG. 1 will now be detailed with reference to the waveform diagram of FIG. 2 and based on the following assumptions and notes: 1) a transistor saturates when its base current ($I_b$) multiplied by its forward current gain ($\beta$) is greater then the available collector current ($I_c$). Its collector-to-emitter voltage ($v_{CESAT}$) is then, typically, 0.2 or 0.3 volts; and 2) it is assumed that the $\beta$'s of the transistors are relatively high and equal to each other and that their forward base-to-emitter voltage drops ($V_{BE}$'s) which are typically 0.7 volts, are also equal to each other.

Consider first the condition immediately following Q1 being rendered conducting and Q2 non-conducting, corresponding to time $T_0$ in FIG. 2. This marks the termination of the dwell period of timing capacitor C1, and the time at which the base of Q1 is charged to $V_{BE}$ volts rendering Q1 conducting while Q2 is non-conducting. Since transistor Q2 is non-conducting, the collector current I4 of transistor Q4 flows into capacitor C2, displacing a current of amplitude I into the base of transistor Q1 which is turned on hard.

The turn on of Q1 at $t_0$ leads to the discharge of C1 and the reverse biasing of Q2. With a current I4 of amplitude I supplied to its base, Q1 draws a collector current ($I_{C1}$) equal to $\beta_1 I$ and produces an emitter current ($I_{E1}$) equal to $(\beta_1+1)I$; where $\beta_1$ is the $\beta$ of Q1. $I_{C1}$ is much greater than I3 and a sharp negative going voltage transition is produced at node A (collector of Q1 and plate P of C1). This negative going transition is coupled via capacitor C1 to the base of Q2 and to the emitter of discharge transistor Q5. Since the voltage across the capacitor cannot change instantaneously, the voltage at the other plate R, of C1 tries to go negative by the same amount. However, as soon as the potential at R tries to go below $-V_{BE}$ volts, Q5 turns-on and its base-to-emitter junction clamps the base potential ($V_{BQ2}$) of Q2 to $-V_{BE}$ volts. As soon as Q5 turns on its collector-to-emitter path provides a low impedance path across C1 quickly discharging C1.

More precisely, Q1 and Q5 draw relatively large currents which quickly discharge C1. The magnitude of the currents drawn by Q1 and Q5 may be determined as discussed below. Since the voltage at R is negative (by at least a $V_{BE}$ drop) with respect to ground, most of $I_{E1}$ flows into the base of Q5. The base current ($I_{B5}$) of Q5 is equal to $(\beta_1-1)I$ since two units of current (2I) flow back through the battery 15 into the current sources Q3 and Q4 producing I3 and I4. The resultant emitter current ($I_{E5}$) of Q5 which is the net discharge current displaced through C1 is equal to $(\beta_5+1)(\beta_1-1)I$. Where $\beta_1$ and $\beta_5$ are the forward current gains of Q1 and Q5, respectively. In a similar fashion, it can be shown that the emitter current ($I_{E6}$) of Q6 which is equal to the discharge current through C2 will be equal to $(\beta_6+1)(\beta_2-1)I$. Where the Betas of the transistors are equal, $I_{E5}=I_{E6}$. The effect of Q5 and Q6 is to amplify the discharge current of amplitude $[(\beta-1)I]$ produced by Q1 and Q2 by a factor of $(\beta+1)$; (for simplicity, the $\beta$ of all the transistors are assumed equal).

At time $t_1$, C1 is fully discharged; Q1 saturates and the potential at its collector ($V_A$) is held at $V_{CESAT}$. Q2 is reverse biased and C2 continues to be charged via current source Q4 towards $V_{CC}$-$V_{CESAT}$ until time $t_2$.

As long as the amplitude I4 is constant, $V_B$ and the potential across capacitor C2 increases linearly as shown for the period $t_0$ to $t_2$ in waveform B of FIG. 2. At time $t_2$ as $V_B$ becomes more positive than the base potential ($V_{BQ4}$) of Q4, the emitter-to-collector potential ($V_{CE4}$) of Q4 decreases until it equals the $V_{CESAT}$ of Q4. Transistor Q4 then no longer functions as a constant current source; the amplitude of I4 decreases considerably and can no longer maintain Q1 in saturation. As a result, beginning at time $t_2$, I3 which had been sunk by Q1 now begins to flow through capacitor C1 into the base of Q2. The current I3 charges the base-to-emitter capacitance of Q2, raising the potential ($V_{BQ2}$) at its base from $-V_{BE}$ volts at time $t_2$ to $+V_{BE}$ volts at time $t_3$, as shown for $V_{BQ2}$ in FIG. 2. Concurrently, at time $t_2$, transistor Q1 begins to turn off since node B is charged up to $V_{CC}$-$V_{CESAT}$ and little, if any, current flows into the base of Q1. From $t_2$ to $t_3$, $V_B$ as shown in waveform B, is at $[+V_{CC}-V_{CESAT}]$ volts while $V_A$ is increasing linearly. Concurrently, the I3 current source supplies a current of amplitude I via C1 into the base of Q2. At time $t_3$, $V_{BQ2}$ is at $+V_{BE}$ and Q2 turns on, initiating the discharging period of capacitor C2. When Q2 turns on, there is a sharp voltage drop at node B which cause the potential at plate X to go considerably below ground potential. The potential at X, thus, has a polarity and magnitude to turn-off transistor Q1 and turn-on transistor Q6. The base-to-emitter junction of transistor Q6 prevents $V_{BQ1}$ from going more than $V_{BE}$ volts below ground. In addition, Q6 amplifies the emitter current ($I_{E2}$) of Q2 and its collector-to-emitter path provides a high speed discharge path for capacitor C2.

From time $t_3$ to $t_4$ transistors Q2 and Q6 function to discharge capacitor C2 in a similar manner to that described for transistors Q1 and Q4 is discharging C1.

Concurrently, $V_A$ continues to increase linearly, $V_{BQ1}$ is driven to and stays at $-V_{BE}$, while $V_{BQ2}$ stays at $V_{BE}$.

$V_A$ continues to increase linearly until $t_5$ when it reaches the $V_{CC}$-$V_{CESAT}$ level. $V_A$ remains at that level until time $t_6$ when C1 is discharged as for the time period beginning with $t_0$ discussed above.

In circuits embodying the invention the amplitude of the current discharging the timing capacitor is equal to I $(\beta-1)$ $(\beta+1)$. The timing capacitor discharge current in the prior art circuit in which the discharge path includes a diode, rather than the emitter-base path of Q5 or Q6, is equal to I $(\beta-1)$. The discharge current in circuits embodying the invention is a factor of $(\beta+1)$ greater than in prior art circuit. The time to discharge the timing capacitor is inversely proportional to the discharge current. Thus, in circuit according to the invention the discharge time is $1/(\beta+1)$ times the prior art discharge time.

The astable multivibrator, so far described, can assume an operating condition in which both nodes A and B are charged to $V_{CC}$-$V_{CESAT}$ and in which Q1 and Q2 are turned off (as are Q5 and Q6). For this condition, the astable multivibrator hangs up, i.e. cannot oscillate. To eliminate this possibility and to ensure oscillation, the astable-multivibrator includes a network, comprised of PNP transistors Q7 and Q8, which can also be used to control the frequency of oscillation of the astable multivibrator. The emitter-to-collector path of transistor Q7 is connected between node A and the base of Q1 and the emitter-to-collector path of transistor Q8 is connected between node B and the base of Q2. The bases of Q7 and Q8 are connected to a source 18 of control voltage ($V_C$). Each one of transistors Q7 and Q8 conducts when the potential at its emitter (node A or B) is $V_{BE}$ volts more positive than $V_C$. Hence, the point at which Q7 or Q8 turns on can be controlled by varying $V_C$. ($V_C$ may be set to some voltage $V_1$ which is less than $V_{CC}$-$V_{BE}$-$V_{CESAT}$ and which is also less than the bias voltage applied to the bases of current source transistors Q3 and Q4 minus a $V_{BE}$ and minus a $V_{CESAT}$; but $V_1$ must be more positive than the voltage applied to terminal 12.)

The operation of the oscillator start and charging period control circuit is now discussed.

With Q7 and Q8 connected in the circuit, and with $V_C$ set to $V_1$, one of Q7 and Q8 will turn on before the other and supply base drive to its corresponding transistor Q1 or Q2 causing one of Q1 and Q2 to turn on. The turn on of one of Q1 and Q2 causes the other one of Q1 and Q2 to turn off. Thus, for example, if Q7 causes Q1 to turn on before Q2, $V_A$ goes negative before $V_B$ and Q2 gets turned off ensuring that Q1 will be turned on while node B charges up toward $V_{CC}$-$V_{CESAT}$. [Note that Q7 or Q8 is turned off as soon as the transistor (Q1 or Q2) to which it supplies base drive is turned on.] When $V_B$ reaches a level equal to $[V_C+V_{BE}]$ volts transistor Q8 turns on and supplies base drive to Q2, thereby causing Q2 to turn on and Q1 to turn-off. The relatively high gain of the loops formed by Q7-Q1 and Q8-Q2 ensures continued oscillation of the astable multivibrator configuration once initiated. Although the circuit may be manufactured using well controlled integrated circuit techniques, it is virtually impossible for the two halves of the astable-multivibrator to be completely identical. Thus, any noise or, an extremely small difference causes one of the transistors in the loop to conduct a little more or a little earlier than another and this is sufficient to initiate oscillations which are then self-sustaining.

The frequency of oscillation of the multivibrator is controlled by the value to which $V_C$ is set so long as the voltage at node A, $V_A$, or node B, $V_B$, can go more positive than $V_C$ by at least a $V_{BE}$ drop. With $V_C$ set sufficiently below $V_{CC}$, whenever $V_A$ or $V_B$ reaches $V_C+V_{BE}$, one of the control transistors (Q7 or Q8) is turned on causing the termination of the charging period of one timing capacitor and the initiation of the charging period of the other timing capacitor. For example, with Q8 in the circuit, node B charges up to $V_C+V_{BE}$ instead of to $[V_{CC}-V_{CESAT}]$. When node B reaches $V_C+V_{BE}$, Q8 turns on causing most of I4 to flow through its collector-to-emitter path into the base of Q2 instead of via capacitor C2 into the base of Q1. Q2 is thus quickly turned on and Q1 quickly turned off.

Thus, whenever $V_A$ or $V_B$ reaches $V_C+V_{BE}$ one of the control transistors (Q7 or Q8) is turned on and the charging period of one timing capacitor is terminated while its discharge cycle is initiated. Concurrently, the charging cycle of the other timing capacitor is initiated. Furthermore, with Q7 and Q8 in the circuit, the switching transitions will be sharper and the dwell time (e.g. the time between $t_2$-$t_3$ in waveform B) and the off time (e.g. the time between $t_4$-$t_5$ in waveform B) will be decreased.

Thus, the base-to-emitter region of a control transistor (Q7 or Q8) is used to sense the value of a nodal voltage ($V_A$ or $V_B$) and to compare it to some control voltage ($V_C$). The output at the collector of the transistor is then used to control the termination of a charging period or the initiation of a discharge period.

Figure 3:
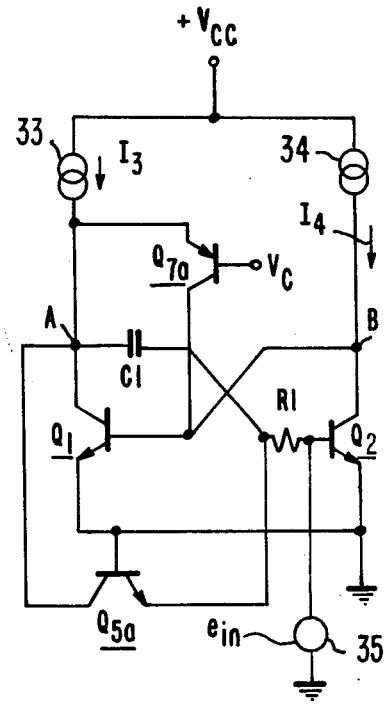
FIG. 3 is a schematic diagram of a monostable multivibrator embodying the invention.

FIG. 3 shows a monostable multivibrator embodying the invention. Current sources 33, 34 supply currents into nodes A and B, respectively. The base of Q1 is directly connected to the collector of Q2. The base of Q2 is capacitively coupled via timing capacitor C1 to the collector of Q1. [Note that a resistor R1 may be inserted in series with the base of Q2 to decrease the loading on an input signal source 35 connected to the base of Q2]. A discharge transistor Q5a and a control transistor Q7a are connected in the circuit in the same manner as transistors Q5 and Q7 in FIG. 1. A timing cycle can be initiated by means of input source 35 connected to the base of Q2. A positive going spike or pulse is sufficient to turn on Q2. The turn on of Q2 turns off Q1 and current source 33 then charges C1 and supplies sufficient base drive to Q2 to hold it in saturation. In the absence of Q7a, when node A is fully charged to a voltage close to $V_{CC}$, the base drive to Q2 diminishes, and it no longer sinks all of I4. Some of I4 then makes a negative going transition, Q2 is turned off, Q5a is turned on and C1 is discharged to its initial condition (with node A at $V_{CESAT}$ and the base of Q2 at $-V_{BE}$) via transistor Q5a and Q1. The discharge of C1 is similar to that described above and need not be repeated in detail. Following the turn off of Q2 current source 34 supplies base drive to Q1, holding Q1 on. The base of Q2 remains at $-V_{BE}$ volts (assuming source 35 allows the base of Q2 to go negative by that amount) until a new timing cycle is initiated by circuit 35. The quick discharge of C1 enables a new cycle to be initiated and a full timing cycle produced very shortly after the termination of a previous cycle. Thus, the frequency response of the circuit is considerably improved.

The timing period of the monostable can be controlled and varied by the addition of transistor Q7a to whose base is applied a voltage $V_C$ the combination functioning in a similar manner to transistor Q7 and $V_C$ of FIG. 1. In response to a positive going triggering pulse produced by input source 35, Q2 is turned on and the voltage at node B makes a relatively sharp negative going transistion from $V_{BE}$ volts to $V_{CESAT}$. The turn on of Q2 turns off Q1 causing node A and C1 to charge towards $V_{CC}$. $V_B$ will remain at $V_{CESAT}$ during the charging period of C1. With transistor Q7a in the circuit the waveform at A will be a ramp rising from $V_{CESAT}$ to $V_C + V_{BE}$. When the ($V_C + V_{BE}$) voltage level is reached Q7a is turned on supplying large base drive to Q1 which is quickly turned on discharging C1 and rapidly turning off Q2 and turning on Q5a. Thus, at the termination of the charging period the voltage at node A makes a sharp negative going transition to $V_{CESAT}$ and the voltage at node B makes a sharp positive going transition clamped at $V_{BE}$ volts by Q1. The rising and falling edges of the pulse produced at node B will be relatively sharp while the pulse width can be controlled in part by varying $V_C$. The waveform at A will include a linear ramp while C1 is charging followed very quickly by a relatively sharp discharge. Consequently, with Q7a in the circuit the dwell time is considerably decreased.

In the FIGURES, the switching and discharging transistors are shown as NPN types while the current source and control transistors are shownto be of PNP type. It should be evident that the NPN and PNP transistors could be interchanged with due care for the polarity of the operating and bias potentials.

For purpose of illustration, the FIGURES show the "charging" of the timing capacitors by means of current sources and the "discharging" of the timing capacitors by means of a current amplifying circuit (Q1, Q5 and Q2, Q6). It should be evident that the circuit could be configured, particularly where PNP transistors are replaced by NPN's and vice versa, to have the timing capacitors "discharged" by the current sources and "charged" by means of a current amplifying circuit. Consequently, as used in this specification and in the claims appended hereto "discharging" the timing capacitors refers to decreasing the potential difference across the capacitors while "charging" the timing capacitors refers to increasing the potential difference across the capacitors.

In the FIGURES, bipolar transistors have been used to illustrate the invention. However, it is to be understood that other known types of transistors, such as field effect transitors may be used to practice the invention. Therefore, the term "transistor", when used without limitation in the appended claims, is used in a generic sense. The conduction path of a transistor refers either to the main conduction path defined by the collector and emitter of a bipolar transistor or to the conduction path (channel or region) present between the drain and source electrodes of an IGFET. The control electrode of a transistor refers either to the base of a bipolar transistor or to the gate electrode of an IGFET. Specifically, for example, in FIG. 1 the discharge transistors (Q5, Q6) could be replaced by insulated-gate field-effect transistors (IGFETs) of N-conductivity type (N channel), and the control transistors (Q7, Q8) could be replaced by P-channel IGFETs. The current source transistors (Q3, Q4) of FIG. 1 could also be replaced by P channel IGFETs with appropriate biasing applied to their control electrodes to cause them to conduct a constant current.

What is claimed is:

1. In a circuit in which a current source in the collector circuit of a first bipolar transistor provides the charging current for a timing capacitor connected between the collector of the first transistor and the base of a second bipolar transistor and where the charging current is in a direction to forward bias the second transistor, the improvement comprising:
   means for controlling the charging period of said timing capacitor including:
   a third transistor having first and second electrodes defining the ends of its conduction path and a control electrode;
   means connecting the control electrode of said third transistor to a control terminal to which is applied a control voltage; and
   means direct current connecting the conduction path of said third transistor between the collector and base of said first transistor for turning on said third transistor of a function of the voltage difference between said control voltage and the voltage at the collector of said first transistor, and said third transistor, when turned on, supplying a turn-on current to the base of said first transistor.

2. In the circuit as claimed in claim 1 wherein the emitters of said first and second transistors are connected to a first power terminal to which is applied a reference potential;
   wherein said current source is comprised of a first current source transistor having its conduction path connected between a second power terminal and the collector of said first transistor, and biasing means connected to the control electrode of said first current source transistor for producing a relatively constant current in its conduction path when said first current source transistor is operated in its linear region;
   wherein a fixed operating voltage is applied to said second power terminal;
   wherein said control voltage is intermediate the potentials applied to said first and second power terminals; and
   wherein said third transistor is connected in a direction to be turned on when the potential at the collector of said first transistor is within a predetermined value of said control voltage and for then supplying a turn on current to said first transistor.

3. The combination as claimed in claim 1 wherein said third transistor is a bipolar transistor of different conductivity type than said first and second bipolar transistors; said first and second electrodes of said third transistor defining its emitter and collector, respectively, and said control electrode defining its base; wherein the emitter and base of said third transistor are connected between said control terminal and the collector of said first transistor and wherein the collector of said third transistor is connected to the base of said first transistor.

4. In the circuit as claimed in claim 2 wherein a second timing capacitor is connected between the collector of said second transistor and the base of said first transistor;
   wherein a second current source is connected in the collector circuit of said second transistor for providing the charging current for said second timing capacitor; and
   further including means for controlling the charging period of said second timing capacitor comprising a fourth transistor having first and second electrodes defining the ends of its conduction path connected between the collector and base of said second transistor and having a control electrode connected to said control terminal.

5. In the circuit as claimed in claim 4 wherein said fourth transistor is connected in a direction to be turned on when the potential at the collector of said second transistor is within a predetermined value of said control voltage and for then supplying a turn on current to said second transistor.

6. The combination comprising:
first, second, and third transistors; each transistor having first and second electrodes defining the ends of a conduction path and a control electrode for controlling the conductivity of the conduction path,
a timing capacitor;
means connecting the first electrodes of said first and second transistors to a first power terminal; means connecting said capacitor between the second electrode of said first transistor and the control electrode of said second transistor; means connecting the second electrode of said second transistor to the control electrode of said first transistor;
first and second current sources, and a second power terminal;
means connecting said first and second current sources between the second electrodes of said first and second transistors, respectively, and said second power terminal;
a control terminal for the application thereto of a control voltage; and
means for controlling the charging period of said capacitor including means connecting the control electrode and the first electrode of said third transistor between said control terminal and the second electrode of said first transistor for sensing the difference between the voltage at said control terminal and the voltage at said second electrode of said first transistor, and means connecting the second electrode of said third transistor to the control electrode of said first transistor for turning on said third transistor when the potential at said second electrode of said first transistor is within a range between a given value of voltage and said control voltage and for then supplying a turn on current to said first transistor and for discontinuing the turn-on of said third transistor when said potential is outside of this range.

7. The combination as claimed in claim 6 wherein an operating voltage is applied between said first and second power terminals; and
wherein said control voltage is within the range of the operating voltage.

8. The combination as claimed in claim 6 wherein said means connecting the second electrode of said second transistor to the control electrode of said first transistor includes a second timing capacitor; and further including means for controlling the charging period of said second timing capacitor including a fourth transistor with means connecting the control electrode and the first electrode of said fourth transistor between said control terminal and the second electrode of said second transistor and means connecting the second electrode of said fourth transistor to the control electrode of said second transistor for turning on said fourth transistor when the potential at said second electrode of said second transistor is within a given value of said control voltage and for then supplying a turn on current to said second transistor.

9. In a circuit in which a current source in the collector circuit of a first bipolar transistor provides the charging current for a timing capacitor connected between the collector of the first transistor and the base of a second bipolar transistor and where the charging current is in a direction to forward bias the second transistor, the improvement comprising:
means for controlling the charging period of said timing capacitor including;
a third transistor having first and second electrodes defining the ends of its conduction path and a control electrode;
a control terminal for the application thereto of a control voltage; means connecting the control electrode and said first electrode of said third transistor between the collector of said first transistor and said control terminal for sensing the voltage difference between said collector of said first transistor and said control terminal; and
means connecting the second electrode of said third transistor to the base of said first transistor for turning on said third transistor as a function of the voltage difference between said control voltage and the voltage at the collector of said first transistor and, when turned on, supplying a turn-on current to the base of said first transistor.

10. The combination comprising:
first, second and third transistors; each transistor having first and second electrodes defining the ends of a conduction path and a control electrode, the conductivity of the conduction path being controllable in response to a voltage applied between the first and control electrodes,
a timing capacitor;
means connecting the first electrode of said first and second transistors to a first power terminal; means connecting said capacitor between the second electrode of said first transistor and the control electrode of said second transistor; means connecting the second electrode of said second transistor to the control electrode of said first transistor;
first and second current sources, and a second power terminal;
means connecting said first and second current sources between the second electrodes of said first and second transistors, respectively, and said second power terminal;
a control terminal for the application thereto of a control voltage; and
means for controlling the charging period of said capacitor including means connecting the second electrode of said third transistor to the control electrode of said first transistor and control means responsive to the voltage difference between said second electrode of said first transistor and said control voltage, said control means comprising the control electrode-to-first electrode path of said third transistor directly connected through negligible impedance means between said second electrode of said first transistor and said control terminal, for turning on said third transistor only when the potential at said second electrode of said first transistor is within a given value of said control voltage and for then supplying a turn-on current to said first transistor.

* * * * *